(12) United States Patent
Renner et al.

(10) Patent No.: US 7,362,380 B2
(45) Date of Patent: Apr. 22, 2008

(54) EQUILIBRIUM BASED VERTICAL SYNC PHASE LOCK LOOP FOR VIDEO DECODER

(75) Inventors: Karl Renner, Dallas, TX (US); Walter Heinrich Demmer, Nuremberg (DE)

(73) Assignee: Texas Instruments Incorporated, Dallas, TX (US)

( * ) Notice: Subject to any disclaimer, the term of this patent is extended or adjusted under 35 U.S.C. 154(b) by 917 days.

(21) Appl. No.: 10/616,754

(22) Filed: Jul. 10, 2003

(65) Prior Publication Data

US 2005/0007492 A1    Jan. 13, 2005

(51) Int. Cl.
*H03L 7/00* (2006.01)
(52) U.S. Cl. ..................................................... 348/547
(58) Field of Classification Search ................. 348/547, 348/536, 537, 529, 511; 375/376; 327/159, 327/157, 156; 331/179
See application file for complete search history.

(56) References Cited

U.S. PATENT DOCUMENTS

| | | | |
|---|---|---|---|
| 5,459,766 A * | 10/1995 | Huizer et al. | 375/376 |
| 6,169,581 B1 * | 1/2001 | Conover | 348/525 |
| 6,366,327 B1 | 4/2002 | Renner et al. | |
| 6,594,330 B1 * | 7/2003 | Wilson | 375/376 |

\* cited by examiner

*Primary Examiner*—M. Lee
(74) *Attorney, Agent, or Firm*—Wade J. Brady, III; Frederick J. Telecky, Jr.

(57) ABSTRACT

The present invention discloses a PLL (90), which may be implemented in software, hardware, or a combination of software and hardware, which comprises a sync detector (92), a loop filter (94), a vertical sync discrete time oscillator (DTO) (98), and an output logic (100) adapted to detect a vertical sync (222), wherein the loop filter (94), the vertical sync DTO (98), and the output logic (100) are coupled to the sync detector (92).

34 Claims, 5 Drawing Sheets

EQUILIBRIUM BASED VERTICAL SYNC PHASE LOCK LOOP FOR VIDEO DECODER

FIELD OF THE INVENTION

The present invention relates to vertical sync phase lock loops (PLLs) and, more particularly, to an equilibrium based vertical sync PLL for a video decoder.

BACKGROUND OF THE INVENTION

The satisfactory reproduction of a picture requires the transmission of several types of information combined into a single waveform called a composite video signal. The signal is composed of video information and synchronizing information. Composite video describes a signal in which luminance, chrominance, and synchronization information are multiplexed in the frequency, time, and amplitude domain for a single-wire distribution. Luminance is defined as the signal component in color video systems that represents the brightness of the image. Chrominance is defined as the component signal in color video systems that describes color information.

The video signal conveys information concerning the blanking level, the black reference level, average scene brightness level, picture details, and color values. The luminance component of a baseband video signal is unipolar with one direct current ("DC") level (nominally 0 volts) representing blank, and a second level (nominally +700 mV) representing white. Any level between 0 and 700 mV represents a degree of gray. For NTSC and PAL the color information consisting of two orthogonal color vectors is quadrature amplitude modulated (QAM) onto a common subcarrier forming the chrominance component (chroma) whereas SECAM employs frequency modulation (FM) of line-wise alternating carriers for this purpose. This chrominance component (chroma) is superimposed to luminance to form the composite video signal.

The synchronizing information consists of horizontal and vertical scanning synchronization, and chrominance decoder synchronization. The horizontal and vertical synchronization information is used to align the horizontal and vertical deflection circuits in the receiver. The horizontal sync tells the display where to put the video signal in the left-right dimension, and the vertical sync tells the display where to put the signal in the top-bottom dimension. Synchronization consists of pulses having a specific amplitude, duration, and shape best suited to the task at hand. The synchronizing pulses are unipolar with a reference level of 0 V and a peak negative level of nominally −300 mV.

The video signal waveform, with a nominal peak-to-peak amplitude of 700 mV, and the synchronizing signal waveform with a nominal peak-to-peak amplitude of 300 mV, are added together to form a composite video signal of 1 V peak-to-peak. The synchronizing pulses are placed in parts of the composite signal that do not contain active picture information. These parts are blanked (forced at or below the black level) to render invisible the retrace of scanning beams on a correctly adjusted display.

The standard video signal levels apply to both conventional television scanning standards—National Television System Committee ("NTSC") and Phase Alternating Line ("PAL") as well as Sequentiel Couleur à Mémoire ("SECAM"). The U.S standard is NTSC which uses 525 lines at 60 Hz field rate, while PAL and SECAM are predominant in Europe and use 625 lines at 50 Hz field rate. Composite video signals are expressed in IRE units. An IRE unit is defined as one-hundredth of the excursion from the blanking level (0 IRE units) to the reference white level (100 IRE units). A standard 1 V peak-to-peak signal is said to have an amplitude of 140 IRE units (143 for PAL and SECAM) of which 100 IRE units are luminance, and 40 IRE units (43 for PAL and SECAM) are synchronization information. Further discussion of video circuits and signals can be found in the following texts: M. Robin, DIGITAL TELEVISION FUNDAMENTALS, McGraw-Hill (1998); K. Jack, VIDEO DEMYSTIFIED, 2nd Edition, Harris Semiconductor (1996); and A. Inglis, VIDEO ENGINEERING, 2nd Edition, McGraw-Hill (1996), all of which are hereby incorporated by reference. Although different versions of PAL and SECAM are different in terms of chrominance modulation (quadrature amplitude modulation versus FM), RF modulation (negative vs. positive), and sound modulation (FM vs. AM), the luminance component and the synchronization aspects are defined identically. Thus they are commonly referred to hereinafter by the term PAL.

A frame of video is essentially one picture or "still" out of a video stream of pictures. In NTSC, a frame comprises 525 individual scan lines (for PAL 625 lines). For NTSC, after 525 lines have been displayed on the screen, the picture presentation process continues with the next frame of 525 lines. An interlaced TV screen (and only an interlaced scanning system) is made using two fields, each one containing half of the scan lines needed to make one frame. Although in analog terminology, each field is considered to have 262.5 lines, in the digital domain, it is convenient to consider each field comprising a whole number of lines; 263 for the odd field, and 262 for the even field. For NTSC, the lines number 1-263 for the odd field, and 264-525 for the even field. The composite video signal contains a vertical sync pulse which signals the start of the odd and even fields. Two fields comprise a frame. The first 9 lines of both the odd and even fields are vertical sync pulses. For NTSC, 9 lines (7.5 lines for PAL) of both the odd and even fields contain equalization and serration pulses for the purpose of vertical synchronization. Each field is displayed in its entirety—therefore, the odd field is displayed, then the even field, then the odd field, and so on. The vertical scan frequency is chosen so that half of the scanning lines are contained in each field. This causes the first line of alternate fields to begin at the horizontal center of the top line of the picture, and the lines are interleaved between fields. Each field occurs at a rate of 60 Hz for NTSC (50 Hz for PAL) television standards.

The video decoder must lock to the vertical sync and then output a vertical sync for each of the two fields. NTSC consists of 525 horizontal lines per frame or 525 half lines per field; PAL consists of 625 horizontal lines per frame or 625 half lines per field. Odd and even field vertical syncs may be detected by their position with respect to line boundaries; the odd sync switches at a line boundary and the even sync switches at a half line boundary.

Proper vertical lock must be achieved not only for standard video but for non standard video, too. Non-standard video sources, such as VCR, video games, macrovision, and weak noisy signals, present problems to logic that is designed for standard video inputs. In a non-standard video mode, video signals obtained from sources such as the VCR in a trick-mode (rewind, fast forward, and pause modes), and video games, may output frames which do not have the standard number of lines per frame (e.g. 528 lines in a 525-line NTSC standard). Non-standard signals may exhibit a lack of serration pulses which normally indicate the start of the sync pulse. (Vertical sync is identified by broad pulses, which are "serrated" in order for a receiver to maintain horizontal sync, even during the vertical interval). The signal may instead provide one large broad pulse where the serration pulses are normally expected in a standard video signal. The absence of sync level between the end of a broad pulse, and the start of the following sync pulse is called serration. Thus decode from the line counter is not possible. The inability to detect a non-standard signal may result in vertical roll of the picture presented to the viewer.

In a VCR, a horizontal sync jump, which occurs prior to vertical sync due to head switching, makes detection of odd or even field vertical syncs difficult. Due to confusion, odd and even fields may constantly switch in the output picture. Vertical lock may also be difficult to achieve with weak noisy signals which have a low signal to noise ratio. This non-standard mode must be detected and a vertical sync output when a sync is detected at the input.

Another problem arises when there is no video input present. In such a situation, it is still desirable to output a sequence of vertical syncs in a free running mode so that a blank screen is displayed on the monitor. Automatic detection of these modes is a preferred feature which yields a stable blank picture.

Previous implementations of vertical sync detectors for video decoders have used half line accumulators of the input pixels to detect odd and even field vertical syncs. The half line sums are compared against an adaptive threshold based on the minimum half line sum detected over a frame. If a sum falls below the threshold then a vertical sync is detected; an odd or even field is based on the position with respect to the line boundary. If the odd field vertical sync is detected, a line counter is reset to one else the counter increments. If two successive odd field syncs are detected, as in the case of an even number of lines per frame, then the line counter resets on every other odd sync. For a standard video, the odd and even field vertical sync outputs are decoded from the line count. For non standard video, the output is simply generated when a sync at the input is detected. When no video input signal is present, the line counter simply free runs counting from one up to the lines per frame for that standard and then resets to one. A state machine controls the different modes of operation. Consequently, previous implementations of the vertical sync detector could only replenish any eventual missing or undetectable vertical syncs (due to excessive noise, VCR head switch, etc.) at offsets of integer multiples of standard half line increments (525 for NTSC and 625 for PAL). They were incapable of automatically adapting to non standard number of half lines per field.

It is therefore desirable for the present invention to overcome the limitations described above that are involved in a vertical sync PLL for a video decoder.

SUMMARY OF THE INVENTION

The present invention achieves technical advantages as an equilibrium based vertical sync PLL for a video decoder that achieves proper vertical lock for standard video and for non-standard video.

In one embodiment, a vertical sync phase lock loop (PLL) comprises a sync detector, a loop filter, a vertical sync discrete time oscillator (DTO), and an output logic adapted to detect a vertical sync, wherein the loop filter, the vertical sync DTO, and the output logic are coupled to the sync detector.

In another embodiment, a method for outputting a vertical sync comprises receiving a vertical sync sample, producing a total error based on the sample and a vertical sync discrete time oscillator (DTO) value, and driving a phase error, based on the vertical sync DTO value, to a minimum value.

DETAILED DESCRIPTION OF THE INVENTION

Figure 1:
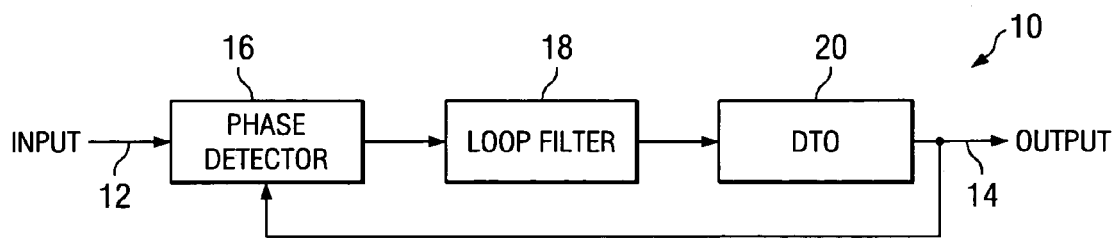
FIG. 1 illustrates a Phase Lock Loop block diagram in accordance with an exemplary embodiment of the present invention.

Referring now to FIG. 1, a Phase Lock Loop (PLL) 10 of the present invention is presented. The PLL 10, which locks to the vertical sync input 12 and generates a vertical sync output 14, and is less susceptible to noise and sync jump distortions in the input, comprises a phase detector 16 which detects the vertical sync at the input 12 and generates a phase error which is filtered by a loop filter 18. The filter 18 output controls a discrete time oscillator (DTO) 20 such that its output is in lock with the input.

Figure 2:
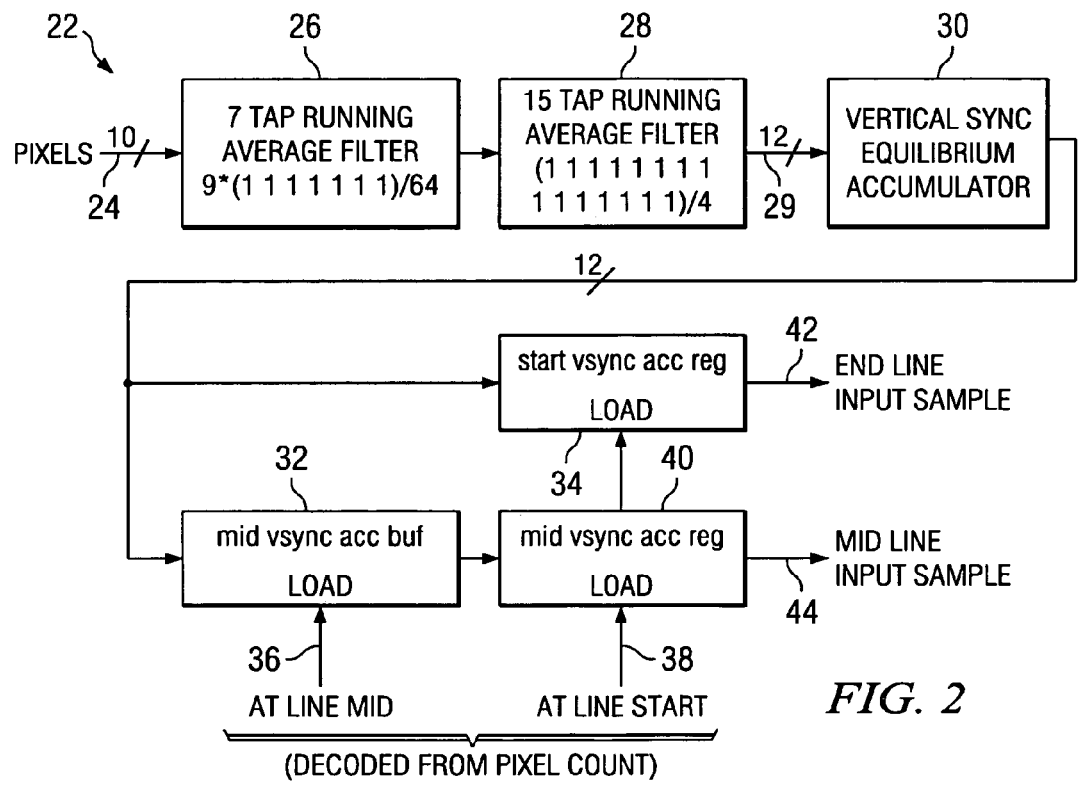
FIG. 2 illustrates a block diagram for generating mid line and end line samples of the vertical sync equilibrium accumulator output in accordance with an exemplary embodiment of the present invention.

Referring now to FIG. 2, a block diagram 22 is depicted that is adapted to generate an end line sample 42 and a mid line sample 44 of the vertical sync equilibrium accumulator output. These samples 42 and 44 are input into a vertical sync detector of the vertical sync PLL of the present invention (described in greater detail in accordance with FIG. 6). Pixels 24 from an analog-to-digital converter (not shown) are input into a 7 tap running average filter 26 (averaging a window of 7 pixels) whose bandwidth is about 860 kHz, and further into a 15 tap running average filter 28 (averaging a window of 15 pixels) whose bandwidth is about 400 kHz. The filters 26 and 28, which are low pass filters, reduce noise present in the input pixels 24 and suppress the color sub-carrier.

The filter output 29 from the 15 tap running average filter 28 is fed to a vertical sync equilibrium accumulator 30, which determines blanking and sync levels of the vertical sync, and also acts as a filter which eliminates horizontal syncs and equalization and serration pulses which occur during the vertical blanking interval. The accumulator generates a signal that corresponds to the filter vertical sync input. Samples from the vertical sync equilibrium accumulator 30 are input to the mid vertical sync accumulator sample buffer 32 and the start vertical sync accumulator sample register 34. The signals at line mid 36 (which indicates the trigger signal forcing the buffer 32 to load and store the momentary numerical content of the accumulator 30) and at line start 38 (described further below) are decoded from a pixel counter and occur at the mid point and start of the line respectively. The output of the mid vertical sync acc buffer 32 is input to the mid vertical sync acc register 40 when the signal at line start 38 occurs. The line start 38 indicates the trigger signal forcing the register 40 to load and store the content of the buffer 32, and further triggers the register 34 to load and store the momentary numerical content of the accumulator 30. The mid line input sample 44 and the end (or start) line input sample 42 are read by the processor and are used to detect vertical sync events.

Figure 3:
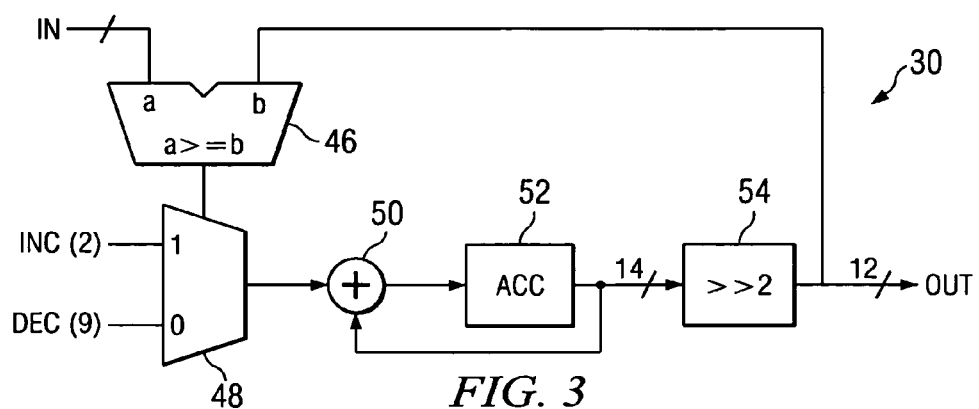
FIG. 3 illustrates a vertical sync equilibrium accumulator circuit in accordance with an exemplary embodiment of the present invention.

Referring now to FIG. 3, the vertical sync equilibrium accumulator 30 is described in greater detail. The equilibrium accumulator 30 is a 23 bit register whose 12 most significant bits (MSBs) are compared with an input from the 15 tap running average filter 28 at a comparator 46. An enable input can be used to disable or freeze the equilibrium level. If the input is greater than or equal to the MSBs, then an increment value is selected by a multiplexer 48; else a decrement value is selected by the multiplexer 48 and appears at its output. The increment and decrement values are chosen based on a ratio of sync/blank timing to the line time. The output from multiplexer 48 is input to an adder 50 which selects this input when enable is true or 0 or when enable is false and a freeze accumulator mode is desired. The output from the adder 50 is fed to an accumulator 52. The output from the accumulator 52 represents a floating equilibrium level for blanking or sync levels. This output is added with the output from the multiplexer 48 which represents the accumulation process and is passed to a binary shift operation 54, where the output is right shifted 2 bits performing a truncated division by 4, for example. This shift sets a time constant which results in a slow variation in the equilibrium level with respect to input changes. The output is fed to the mid vertical sync acc buffer 32 and the start vertical sync acc register 34.

The increment and the decrement value as well as the right-shift value are chosen to obtain a maximum safety margin between any negative-going dips outside vertical serration and any positive-going spikes during vertical serration while resulting in a fast transient for the first serration pulse without any prior synchronization to the input. Another aspect taken into consideration for optimization of the increment, decrement and the right-shift values is their general applicability for all video standards (such as NTSC, PAL, and SECAM) at all sampling rates (such as square pixel and ITU-R BT.601).

Figure 4A:
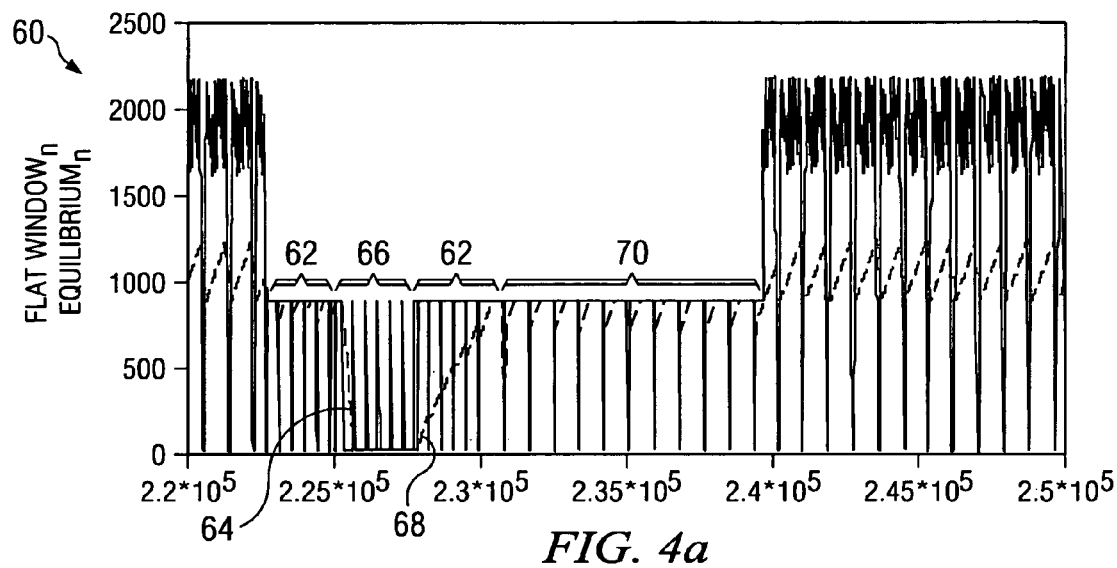
FIG. 4a illustrates a vertical sync equilibrium accumulator output for an even field vertical sync in accordance with an exemplary embodiment of the present invention.
Figure 4B:
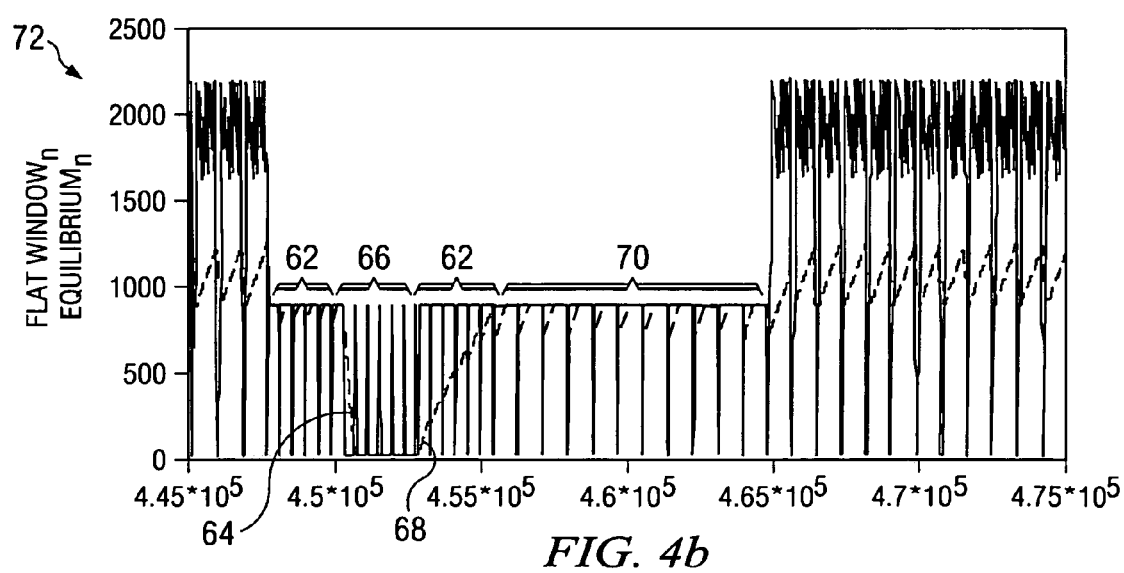
FIG. 4b illustrates a vertical sync equilibrium accumulator output for an odd field vertical sync in accordance with an exemplary embodiment of the present invention.

Referring now to FIGS. 4a and 4b, even and odd field vertical blanking intervals are depicted of a typical video input signal along with the appropriate vertical sync equilibrium accumulator 30 output 60. During active video (not yet numbered) as well as during the series of blanked lines 70 and the series of equalization pulses 62 the vertical sync equilibrium accumulator 30 output 60 only exhibits a sawtooth waveform having a relatively small amplitude while during the vertical serration pulses the vertical sync equilibrium accumulator 30 output 60 drops sharply down to the sync tip level. Any such distinctively sharp drop of the vertical sync equilibrium accumulator 30 output 60 indicates a vertical sync event. Dependent on whether an end line sample 42 or an mid line sample 44 marks the first occurrence of the vertical sync equilibrium accumulator 30 output 60 dropping below a trigger level, the trailing field is indicated an even field (see FIG. 4a) or an odd field (see FIG. 4b), respectively. In accordance with an exemplary embodiment of the present invention, the trigger level is derived as the arithmetical average between the blank level and the sync tip level.

The table below lists the characteristic vertical sync equilibrium accumulator output values for different video standards and different sampling rates at, for example, an increment of 2, a decrement of 9 and a right-shift of 2. It shows a large safety margin in excess of 700 for all combinations of video standards and sampling rates, while the leading negative-going transient is sufficiently steep to safely detect the first vertical serration pulse.

|  | standard | | | |
|---|---|---|---|---|
|  | NTSC | NTSC | PAL | PAL |
|  |  | sampling rate | | |
|  | sq pixel | 601 | 601 | sq pixel |
| (a) max equilibrium during serration | 32.877 | 34.320 | 34.320 | 35.788 |
| (b) min equilibrium during active video | 767.228 | 754.250 | 754.250 | 741.031 |
| equilibrium at end of 1st serration pulse | 84.404 | 18.457 | 18.457 | 18.457 |
| safety margin between a and b | 734.350 | 719.930 | 719.930 | 705.243 |

Figure 5:
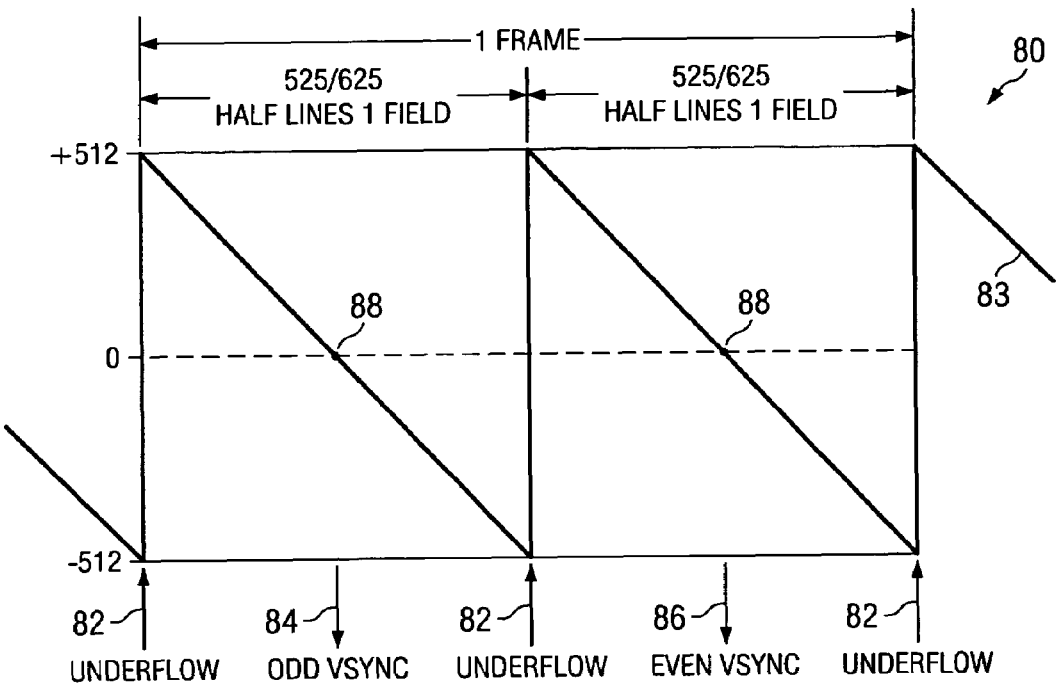
FIG. 5 illustrates characteristics of a vertical sync DTO in accordance with an exemplary embodiment of the present invention.

Referring now to FIG. 5, characteristics 80 of a vertical sync DTO, which is an accumulator that always decrements and cycles once per field and twice per frame, are depicted where the nominal decrement is equal to 1024/half lines per field. When the point of underflow 82 below −512 is reached an increment of 1024 is added 83. The PLL 10 acts to align the sync event 84, 86 with the zero crossing 88 of the DTO when a new field begins.

Figure 6A:
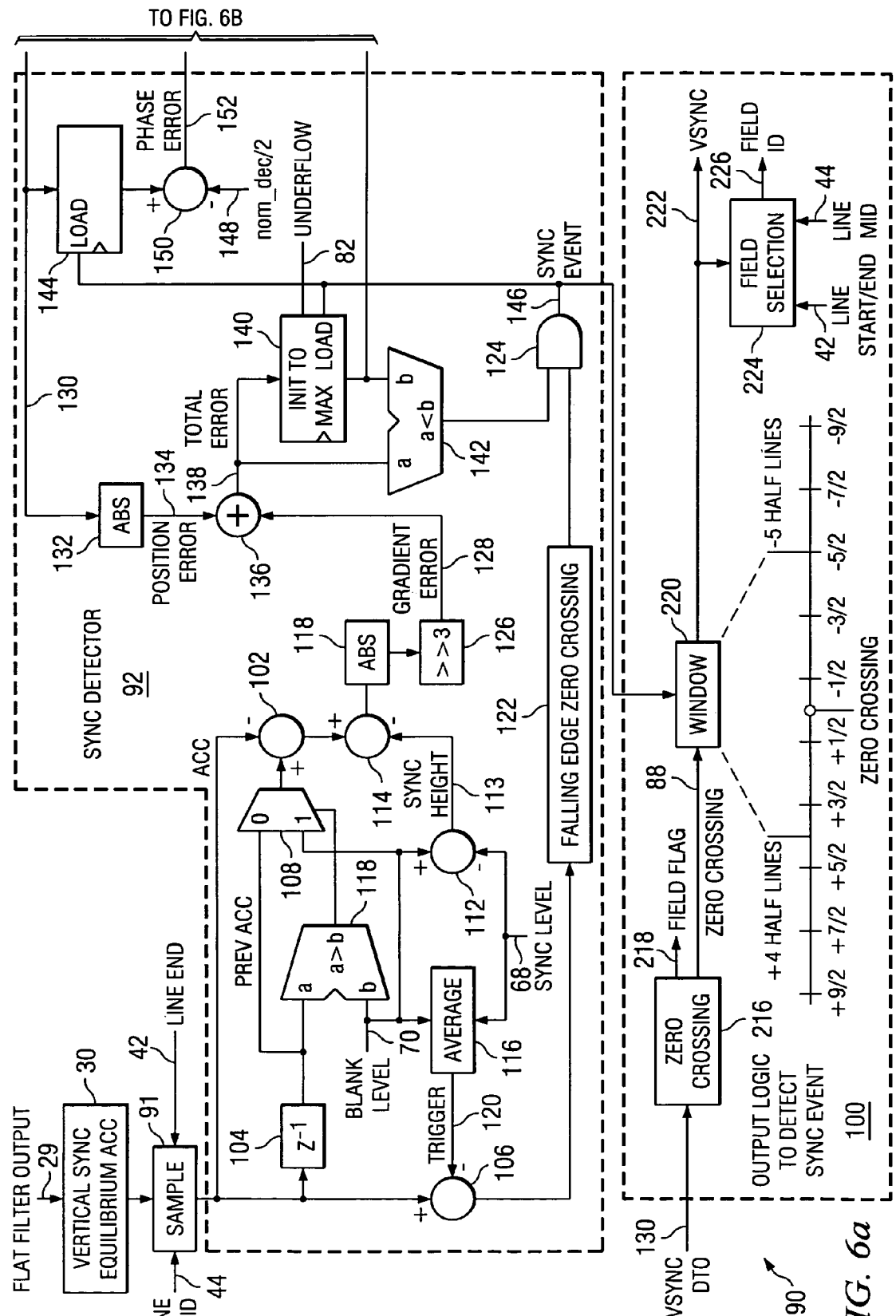
FIG. 6 illustrates a vertical sync Phase Lock Loop in accordance with an exemplary embodiment of the present invention.
Figure 6B:
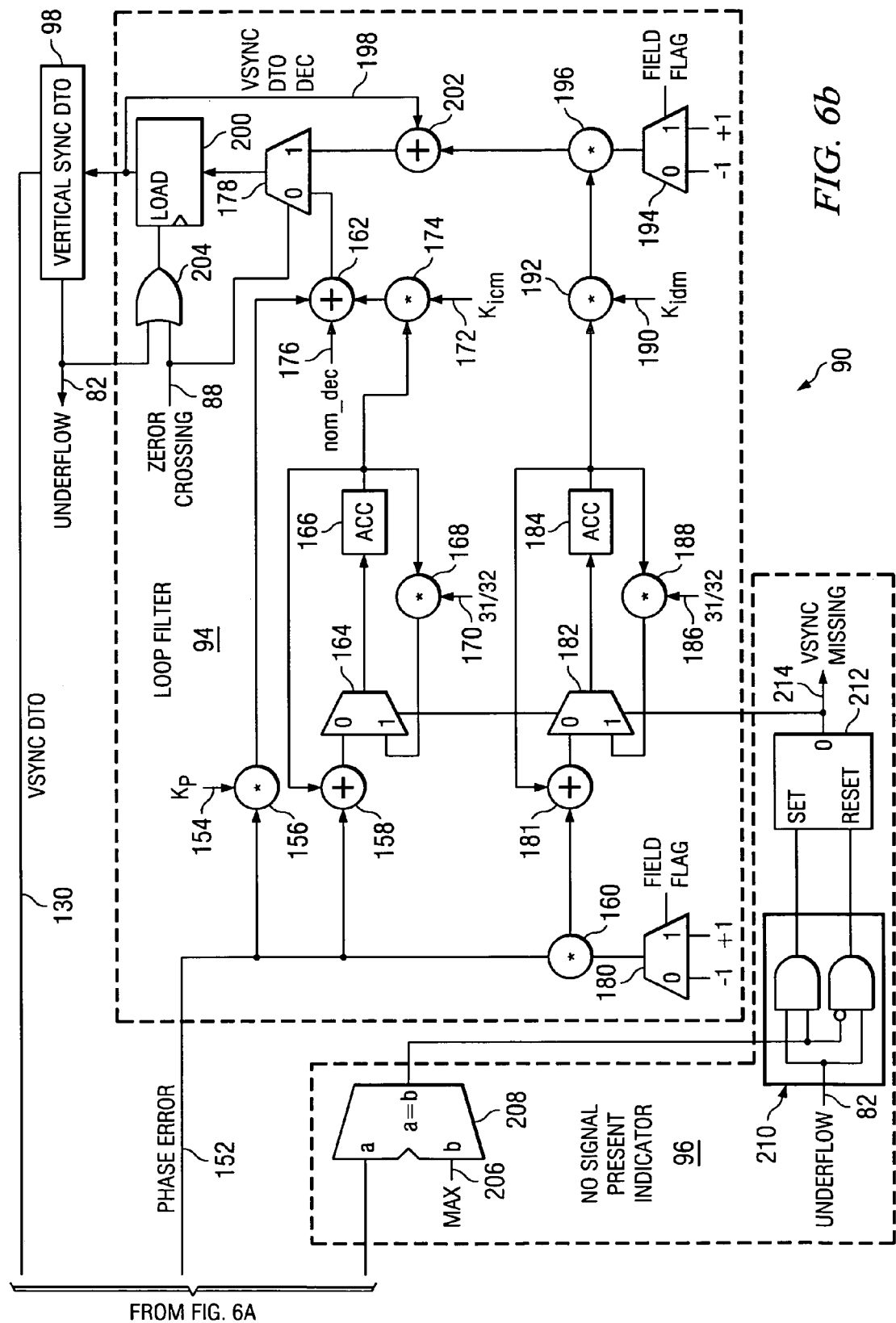

Referring now to FIG. 6 a block diagram of the PLL (or the PLL algorithm) 90, which may be implemented in software, hardware, or a combination of software and hardware, is depicted. The PLL algorithm predominantly comprises a sync detector 92 coupled to a loop filter 94, a no signal present indicator block 96, a vertical sync DTO block 98, and an output logic to detect a vertical sync event 100. The loop filter 94 is further coupled to the no signal present indicator 96 and to the vertical sync DTO 98.

The flat filter output 29 is received by the vertical sync equilibrium accumulator 30 tracing its input signal at two distinctively different slew rates for any rising edges and falling edges, respectively, thereby filtering out the horizontal syncs, equalization pulses, and active video while passing the vertical syncs. The sample block 91 sub-samples the output of the vertical sync equilibrium accumulator 30 twice per line—at line mid 36 and at line start 38—yielding the end line input sample 42, and the mid line input sample 44. These samples are received by a block 102, a delay block 104, and a block 106. The output from the delay block 104 represents the previous output of the vertical sync equilibrium accumulator 30. This output is received by multiplexer 108 and by comparator 110 which further receives the blanking level 70 (please refer to FIGS. 4a and 4b). If the output from the delay block 104 is greater than the blanking level 70, the output of the comparator 110 controls the multiplexer 108 such that the appropriate input to the subtractor block 102 is limited not to exceed the blanking level 70; this limits any previous vsync equilibrium accumulator sample to the blanking level and serves to avoid detection problems in VCR trick mode where the front porch of the vertical sync is elevated above the blanking level. The sample received by block 102 is subtracted from the output of the multiplexer 108 and is received by block 114 which produces a difference between the vsync equilibrium sample difference and the sync height. Block 118 produces the absolute value of the output from block 115 which becomes the gradient error 128.

The sync level 68 (please refer to FIGS. 4a and 4b) is further received by a block 112 and by an average block 116. The sync level 68 is subtracted from the blanking level 70 producing the sync height 113. The sync height 113 is subtracted from the output of the block 102 resulting in a signed gradient error whose absolute value is produced at an absolute value block 118 yielding an absolute gradient error. The average block 116 produces a trigger level 120 by taking the average of the blanking level 70 and the sync level 68. This trigger level 120 is subtracted from the output of the sample block 91 at the block 106 indicating a trigger event at a falling edge zero crossing. Such trigger condition is detected by a falling edge zero crossing block 122 issuing trigger events which are forwarded to an AND gate 124.

The output from the absolute value block 118 is received at a binary shift block 126, where the output is right shifted, for example, by 3 bits producing a weighted absolute gradient error 128. The current sample value of the vertical sync DTO block 98 is received by an absolute value block 132 which outputs an absolute position error 134. This absolute position error 134 and the weighted absolute gradient error 128 are added at an adder block 136 producing a total error 138 which is input into a register 140 and into a comparator 142. At the event of any underflow (please refer to FIG. 5) of the vertical sync DTO the register 140 is preset to a maximum value. A potential sync event 146 is issued by the AND gate 124 and the register 140 is updated if the comparator 142 indicates any total absolute error 138 corresponding with a trigger event to be less than such total absolute error 138 having been stored previously in register 140. Along with such update of register 140 the momentary (signed) sample value of the vertical sync DTO 130 is stored by a register 144 at any instance of a potential sync event 146. Therefore, for each half-line, a trigger event that minimizes the total error in the register 140 is preferred issuing a new sync event. At the instant of the next vertical sync DTO 98 underflow 82 the register 140 thus contains the minimum absolute total error 138 of the previous field and, correspondingly, the register 144 contains the vertical sync DTO 98 value sampled at the moment of the optimal sync event 146. A quarter-line phase offset is introduced by means of the subtractor block 152 subtracting half a nominal DTO decrement value 148 from the value stored in register 144 thereby producing a phase error term 152. The offset value 148 is necessary so that the zero crossing is positioned between +nominal decrement/2 and −nominal decrement/2 such that any uncertainty is eliminated.

The PLL 90 acts to drive the phase error term 152 to a minimum. The PLL 90 is a second order digital system in which the loop filter 94 consists of a proportional gain constant $K_p$ 154, a common mode integral gain constant $K_{icm}$ 172, and a differential mode integral gain constant $K_{idm}$ 190 that are applied to the phase error 152. The common mode integral gain constant $K_{icm}$ 172 compensates for any deviation of the lines per frame from the standard number of lines per frame, and the differential mode integral gain constant $K_{idm}$ 190 compensates for any difference in lines per field of even and odd fields as can occur with non-standard video sources, and more particularly with VCRs in trick mode such as pause, fast forward or reverse.

The phase error 152 is accumulated in a common mode integral accumulator register 166 whose value compensates for non standard half lines per field. The differential mode integral accumulator register 184 accumulates a value which compensates for a difference in the number of half lines per field; in one field the phase error 152 is added and in the next field it is subtracted. The accumulator values may be computed as shown below:

LPF=nominal half lines per field
$lpf_1$=actual half lines per field 1
$lpf_2$=actual half lines per field 2
n=number of integer bits in DTO
f=number of fractional bits in DTO $$\text{common mode } acc = 2^{n+f} * ((1/lpf_1 + 1/lpf_2)/2 - 1/LPF)/K_{icm} \quad (1)$$

$$\text{differential mode } acc = 2^{n+f} * (1/lpf_1 - 1/lpf_2)/(2*K_{idm}) \quad (2)$$

For the case of channel change between standard video sources, the common mode accumulator is forced to decay which results in a critically damped PLL step response and a fast lock time. The decay accumulator decision logic is shown below. The decay condition is based on detection of a rapid change in phase error provided it is larger than a minimum value.

$$\text{decay } acc = ((abs(prev\_vsync\_phase\_error) > 7/4 * vsync\_phase\_error) \&\& ((abs(vsync\_phase\_error) >> 21) > 6)) \quad (3)$$

The phase error 152 is received at a multiplier 156, at an adder 158, and at a multiplier 160. The proportional gain constant $K_p$ 154 and the phase error 152 are multiplied at the multiplier 156 whose result (a proportional phase error term) is received at adder 162. The phase error 152 is added to an output of an accumulator 166 at adder 158 whose result is received by a multiplexer 164. The output of the multiplexer 164 is received by the accumulator 166 whose output is further multiplied by a factor of 31/32 170 at a multiplier 168. The result from the multiplier 168 is the second input to the multiplexer 164. The output of the accumulator 166 is further multiplied by the common mode integral gain constant $K_{icm}$ 172 at multiplier 174 whose output (a common mode integral phase error term) is added to the proportional phase error term and to the nominal decrement value 176 at adder 162. This sum is received by a multiplexer 178.

The phase error 152 is received at the multiplier 160 where it is multiplied by an output from the multiplexer 180 which adds the phase error 152 for one filed and subtracts the phase error for the other field. Therefore, if a difference in lines per field or half-lines per field exists, that will cause a value to build up that compensates for that difference. Specifically, and similarly to description above, the output of the multiplier 160 is added to an output of an accumulator 184 at adder 181 whose result is received by a multiplexer 182. The output of the multiplexer 182 is received by the accumulator 184 whose output is further multiplied by a factor of 31/32 186 at a multiplier 188. The result from the multiplier 188 is the second input to the multiplexer 182. The output of the accumulator 184 is further multiplied by the differential mode integral gain constant $K_{idm}$ 190 at multiplier 192 whose output (a differential mode integral phase error term) is multiplied at multiplier 196 by an output from the multiplexer 194 which adds the phase error 152 for one filed and subtracts the phase error for the other field.

The output of the multiplier 196 is added to a vertical sync DTO decrement value 198, which is received from a DTO decrement register 200, at adder 202. This sum comprises the other input into the multiplexer 178 whose output is received by the decrement register 200 where the decrement value differential mode accumulator is modified. The proportional phase error term and the common mode integral phase error term are added to the nominal decrement value and the decrement register 200 updates at the point of underflow 82. As previously mentioned, when the point of underflow 82 below −512 is reached an increment of 1024 is added 83 and starts decaying through again. The decrement register 200 further updates with the differential mode term at the zero crossing 88 where a new field starts. The point of underflow 82 and the point zero crossing 88 are logically—Ored 204 to the decrement register 200.

The sign of the differential mode term switches based on the current field or field flag. The field flag signal controlling the multiplexers 180 and 194 toggles from field to field even if only fields of one sort (even or odd) are detected. At the halfway point to the field, the register 140 is initialized to a maximum value so if a sync is detected, a lower value will be loaded into the register because there is some total error that corresponds to that sync event. If no signal is present, the register 140 will not be loaded with any value besides its maximum value 206. When underflow 82 is present, the contents of the register 140 are compared against its maximum value at a comparator 208. If the contents of the register 140 and the maximum value are equal, the output of the comparator 208 and the value of the underflow 82 are received by a flip-flop 210 whose output is further received by a register 212. The register 212 sets or resets at the point of underflow 82, and if at underflow, a bit is set to 1 indicating vertical sync is missing 214 (or not present). In such a situation, the accumulator values decay by a factor of 31/32 down to 0 and the nominal vertical sync output (or nominal lines per frame) is output producing a quiet blank screen when no signal is present. If not at underflow, the bit is reset to 0 indicating that a vertical sync was found.

When the vertical sync DTO 130 is received by a zero crossing detector block 216, a field flag 218 and the zero crossing 88 are output. The zero-crossing 88 causes a window 220 (that is centered on the zero crossing 88 of the vertical sync DTO 98) to open. For example and illustration purposes only, the window width is +4 half lines to −5 half lines. The window 220 further receives the sync event 146 and checks for alignment of the sync event 146 and the PLL 90 output (vsync) 222. If the sync event 146 does not align with the vertical sync 222, then the windowed sync event 146 itself is output instead of the PLL output. If the sync event 146 falls outside the window 220, then the vsync DTO zero crossing 88 (PLL output) is selected as the vertical sync 222. This features account for cases where the input video is unstable and the vertical sync 222 cannot track the input sync 146 fast enough (for example, a VCR pause mode, trick mode, etc.). In such a situation, the sync event is output directly, provided it falls within the window.

In addition to the vertical sync 222, another output of the PLL 90 is a field identification (ID) 226. The field ID is generated when an odd vertical sync is output. It is true (or high) for an odd field sync 84 and false (or low) for an even field sync 86. If non standard video is present and the number of lines per frame are even then the field ID remains true.

Figure 7:
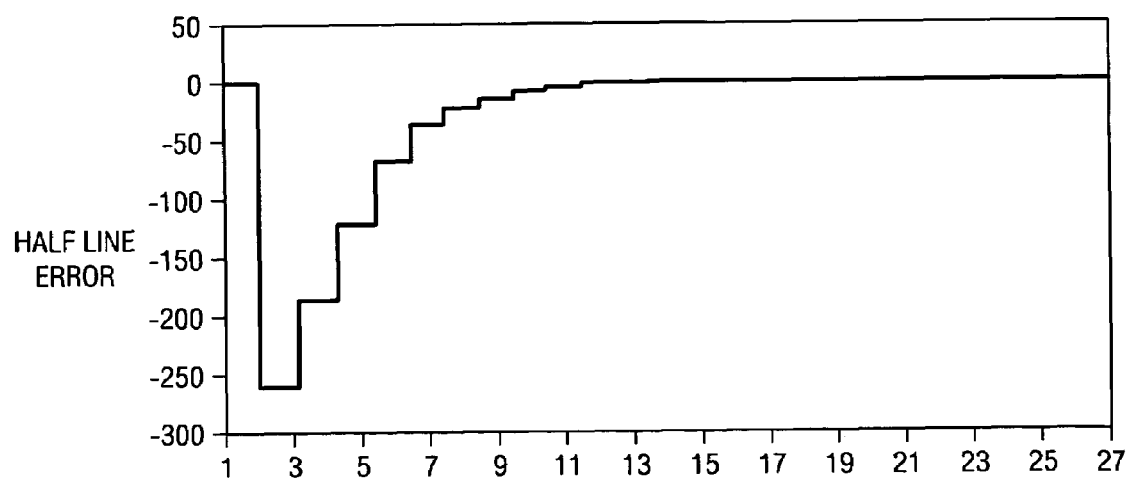
FIG. 7 illustrates an NTSC vertical sync step response in accordance with an exemplary embodiment of the present invention.

Referring now to FIG. 7, a step response of the vertical PLL for NTSC for a worse case condition where the input vertical sync has shifted one half of a field. The response is critically damped and fast lock is achieved in 12 fields.

In conclusion, the vertical sync PLL or algorithm 90 provides a multitude of advantages including: a trigger level for vertical sync that adapts to an input and is based on equilibrium levels for blank and sync; a vertical sync equilibrium accumulator that filters out noise and horizontal syncs, and passes the input vertical sync; the algorithm runs at a half line rate where the input consists of two samples of the vertical sync equilibrium accumulator per line; a minimization of the total error which consists of a position error and a gradient error; the position error forces the PLL to drive the DTO to zero plus an offset equal to −nominal decrement divided by two when a sync event at the input occurs; a gradient error that forces the PLL to ignore the effect of macrovision pseudosyncs on the vertical sync equilibrium accumulator output; a common mode accumulator and integral gain $K_{icm}$ compensates for non standard number of lines per field; a differential mode accumulator and integral gain $K_{idm}$ compensates for a different number of nonstandard half lines per field; a window mechanism which checks for alignment of input sync and output sync; a DTO that represents a flywheel which is slow to respond to noise and abrupt changes in the input; and, in order to achieve fast lock and a critically damped vertical PLL response, the common mode accumulator is forced to decay based on a detected decay accumulator condition.

Although an exemplary embodiment of the present invention has been illustrated in the accompanied drawings and described in the foregoing detailed description, it will be understood that the invention is not limited to the embodiments disclosed, but is capable of numerous rearrangements, modifications, and substitutions without departing from the spirit of the invention as set forth and defined by the following claims.

What is claimed is:

1. A vertical sync phase lock loop (PLL), comprising:
   a sync detector;
   a loop filter;
   a vertical sync discrete time oscillator (DTO);
   an output logic adapted to detect a vertical sync; the loop filter, the vertical sync DTO and the output logic being coupled to the sync detector; and
   a vertical sync equilibrium accumulator adapted to filter horizontal syncs and pass vertical syncs.

2. The PLL of claim 1, further comprising a no signal present indicator coupled to the sync detector and to the loop filter, wherein the loop filter is further coupled to the vertical sync DTO.

3. The PLL of claim 1, wherein the output logic is adapted to output the vertical sync.

4. The PLL of claim 1, wherein the output logic is adapted to output a field identification.

5. The PLL of claim 1, further comprising a sample block adapted to receive the vertical syncs, an end line input sample, and a mid line input sample, and is further adapted to output a sample at an end line and at a mid line, wherein the sample block is coupled to the vertical sync equilibrium accumulator and to the sync detector.

6. The PLL of claim 5, wherein the sync detector is adapted to output a phase error, based on the received sample at the end line and at the mid line, to the loop filter.

7. The PLL of claim 5, wherein the sync detector is adapted to output at least one of a following value from a group consisting of:
   if a sync is detected, a lower than maximum value; and
   if a sync is not detected, a maximum value; based on the received sample at the end line and at the mid line, to the no signal present indicator.

8. The PLL of claim 6, wherein the loop filter is adapted to output a vertical sync discrete time oscillator decrement value.

9. The PLL of claim 8, further comprising a vertical sync discrete time oscillator coupled to the loop filter and to the sync detector, wherein the vertical sync discrete time oscillator is adapted to receive the vertical sync discrete time oscillator decrement value.

10. The PLL of claim 9, wherein the vertical sync discrete time oscillator is adapted to produce a vertical sync discrete time oscillator value.

11. The PLL of claim 10, wherein the phase error is further based on the vertical sync discrete time oscillator value.

12. The PLL of claim 10, wherein the output vertical sync from the output logic is based on a received sync event from the sync detector and from the vertical sync discrete time oscillator value.

13. The PLL of claim 1, wherein the PLL may be implemented in at least one of a following form from a group consisting of:
   software;
   hardware; and
   a combination of software and hardware.

14. A method for outputting a vertical sync, comprising:
   receiving a vertical sync sample;
   producing a total error based on the sample and a vertical sync discrete time oscillator (DTO) value;
   driving a phase error, based on the vertical sync DTO value, to a minimum value; and
   producing a trigger level based on an average of a blank level and a sync level.

15. The method of claim 14, further comprising producing a trigger event at a falling edge zero crossing based on the trigger level and the sample.

16. The method of claim 15, further comprising producing a gradient error based on a difference between a sync height and the sample, wherein the sync height is based on the sync level, and wherein the gradient error allows effects of macrovision pseudosyncs to be ignored.

17. The method of claim 16, further comprising producing a position error based on the vertical sync DTO value.

18. The method of claim 17, further comprising storing the total error in a register, wherein the total error is based on an addition of the position error and the gradient error.

19. The method of claim 18, further comprising, if an underflow of the vertical sync DTO occurs, presetting the register to a maximum value.

20. The method of claim 19, further comprising issuing a potential sync event and updating the register if the total error corresponding with the trigger event is less than the total error stored previously in register.

21. The method of claim 20, further comprising storing the vertical sync DTO value at a second register during the potential sync event.

22. The method of claim 21, further comprising subtracting a half nominal DTO decrement value from the stored vertical sync DTO value to produce the phase error.

23. The method of claim 22, further comprising producing a proportional phase error term based on the phase error and a proportional gain constant.

24. The method of claim 23, further comprising producing a common mode integral phase error term based on the phase error and a common mode integral gain constant adapted to compensate for non standard number of lines per field.

25. The method of claim 24, further comprising producing a differential mode integral phase error term based on the phase error and a differential mode integral gain constant adapted to compensate for a different number of non standard half lines per field.

26. The method of claim 25, further comprising storing at a third register the vertical sync DTO value based on at least one of a following item from a group consisting of:
   the proportional phase error term;
   the common mode integral phase error term;
   the differential mode integral phase error term; and
   a nominal decrement value.

27. The method of claim 26, further comprising updating the third register at least at one of a following event from a group consisting of:
   a point of underflow; and
   a zero crossing.

28. The method of claim 27, further comprising causing a window that is centered on the zero crossing of the vertical sync DTO to open.

29. The method of claim 28, further comprising receiving the sync event by the window and checking for alignment of the sync event and the vertical sync output.

30. The method of claim 29, further comprising, if the sync event does not align with the vertical sync output, outputting the windowed sync event.

31. The method of claim 29, further comprising, if the sync event falls outside the window, outputting the vertical sync DTO zero crossing.

32. The method of claim 29, further comprising, if the sync event falls within the window, outputting the sync event.

33. The method of claim 29, further comprising outputting a field identifier.

34. The method of claim 14, wherein the vertical sync sample is received at an end line and at a mid line.

* * * * *